(12) United States Patent
Miyoshi et al.

(10) Patent No.: US 9,972,754 B2
(45) Date of Patent: May 15, 2018

(54) LIGHT EMITTING DEVICE INCLUDING LIGHT TRANSMISSIVE MEMBER

(71) Applicant: NICHIA CORPORATION, Anan-shi, Tokushima (JP)

(72) Inventors: Tomonori Miyoshi, Tokushima (JP); Kenji Ozeki, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days. days.

(21) Appl. No.: 15/251,851

(22) Filed: Aug. 30, 2016

(65) Prior Publication Data

US 2017/0062681 A1 Mar. 2, 2017

(30) Foreign Application Priority Data

Aug. 31, 2015 (JP) .................................. 2015-171430

(51) Int. Cl.
*H01L 33/50* (2010.01)
*H01L 33/60* (2010.01)
(Continued)

(52) U.S. Cl.
CPC ............ *H01L 33/505* (2013.01); *H01L 24/16* (2013.01); *H01L 24/32* (2013.01); *H01L 27/156* (2013.01); *H01L 33/46* (2013.01); *H01L 33/507* (2013.01); *H01L 33/508* (2013.01); *H01L 33/60* (2013.01); *H01L 23/49805* (2013.01); *H01L 33/32* (2013.01); *H01L 33/502* (2013.01); *H01L 33/56* (2013.01); *H01L 33/62* (2013.01); *H01L 2224/16225* (2013.01); *H01L 2224/29191* (2013.01); *H01L 2224/32059* (2013.01);
(Continued)

(58) Field of Classification Search
CPC ... H01L 33/505; H01L 33/507; H01L 33/508; H01L 33/46; H01L 23/13; H01L 23/15; H01L 2224/32225
See application file for complete search history.

(56) References Cited

U.S. PATENT DOCUMENTS

2010/0264438 A1 10/2010 Suenaga
2011/0284902 A1 11/2011 Daicho et al.
(Continued)

FOREIGN PATENT DOCUMENTS

JP 2005-123560 A 5/2005
JP 2010-219324 A 9/2010
(Continued)

*Primary Examiner* — Daniel Luke
(74) *Attorney, Agent, or Firm* — Foley & Lardner LLP

(57) ABSTRACT

A light emitting device includes a light emitting element; a light-transmissive member that has a lower surface positioned inside a peripheral edge of an upper surface of the light emitting element in plan view, a first lateral surface extending from the lower surface and having at least one inclined surface that is inclined with respect to the upper surface of the light emitting element, and a second lateral surface positioned above and outside the first lateral surface; a light-transmissive adhesive member positioned inside the second lateral surface in plan view, wherein the adhesive member adheres the upper surface of the light emitting element and the lower surface of the light-transmissive member to each other and covers the first lateral surface; and a light-reflective member covering the second lateral surface.

19 Claims, 10 Drawing Sheets

(51) Int. Cl.
  *H01L 27/15* (2006.01)
  *H01L 23/00* (2006.01)
  *H01L 33/46* (2010.01)
  H01L 33/32 (2010.01)
  H01L 33/62 (2010.01)
  H01L 23/498 (2006.01)
  H01L 33/56 (2010.01)

(52) U.S. Cl.
  CPC ............ *H01L 2224/32225* (2013.01); *H01L 2224/73204* (2013.01)

(56) References Cited

U.S. PATENT DOCUMENTS

| | | |
|---|---|---|
| 2011/0309388 A1 | 12/2011 | Ito et al. |
| 2012/0104452 A1* | 5/2012 | Miyoshi .............. H01L 25/0753 257/99 |
| 2013/0329440 A1 | 12/2013 | Tsutsumi et al. |
| 2015/0102366 A1 | 4/2015 | Wada |
| 2015/0263254 A1 | 9/2015 | Miyoshi et al. |
| 2015/0340574 A1 | 11/2015 | Tamaki |

FOREIGN PATENT DOCUMENTS

| | | |
|---|---|---|
| JP | 2010-272847 A | 12/2010 |
| JP | 2012-004303 A | 1/2012 |
| JP | 2012-169189 A | 9/2012 |
| JP | 2015-012143 A | 1/2015 |
| JP | 2015-015485 A | 1/2015 |
| JP | 2015-079805 A | 4/2015 |
| JP | 2015-188069 A | 10/2015 |
| JP | 2015-220446 A | 12/2015 |

* cited by examiner

LIGHT EMITTING DEVICE INCLUDING LIGHT TRANSMISSIVE MEMBER

CROSS-REFERENCE TO RELATED APPLICATION

This application claims priority to Japanese Patent Application No. 2015-171430, filed on Aug. 31, 2015, the disclosure of which is hereby incorporated by reference in its entirety.

BACKGROUND

The present disclosure relates to a light emitting device.
Light emitting devices are known in which a plate-shaped optical layer and a light emitting element are adhered to each other with a transparent material (see Japanese Unexamined Patent Application Publication No. 2012-4303 and No. 2015-079805).

SUMMARY

According to one embodiment, a light emitting device includes: a light emitting element; a light-transmissive member which has a lower surface positioned inside the peripheral edge of an upper surface of the light emitting element in plan view, a first lateral surface having at least one inclined surface extending from the lower surface and inclined with respect to the upper surface of the light emitting element, and a second lateral surface positioned above and outside the first lateral surface; a light-transmissive adhesive member positioned inside the second lateral surface in plan view, and adhering the upper surface of the light emitting element and the lower surface of the light-transmissive member to each other and covering the first lateral surface; and a light-reflective member covering the second lateral surface.

According to the light emitting device, a self-alignment effect of the adhesive member can be exerted to accurately arrange the light-transmissive member at a desired position.

BRIEF DESCRIPTION

DETAILED DESCRIPTION OF EMBODIMENTS

[Light Emitting Device According to First Embodiment]

Figure 1A:
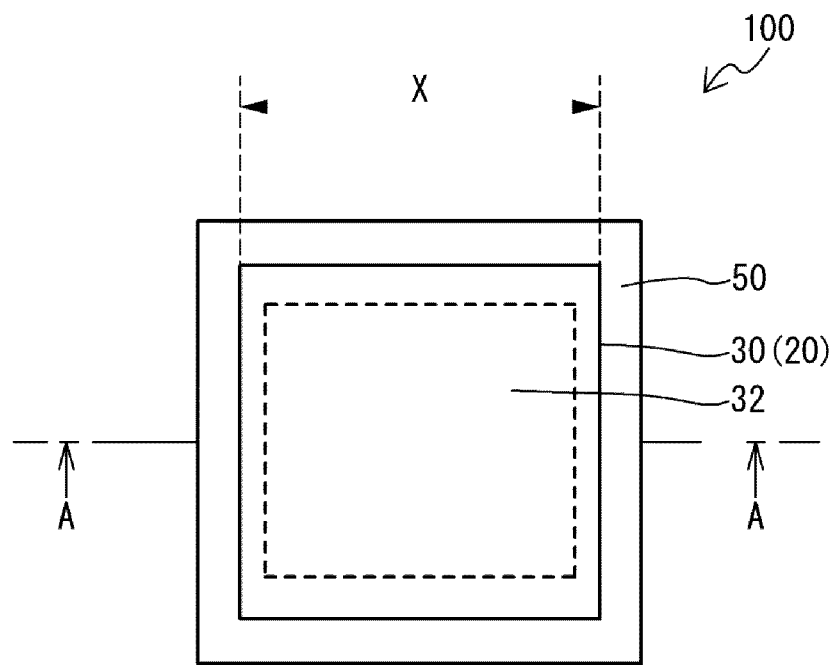
FIG. 1A is a schematic plan view of a light emitting device according to a first embodiment.
Figure 1B:
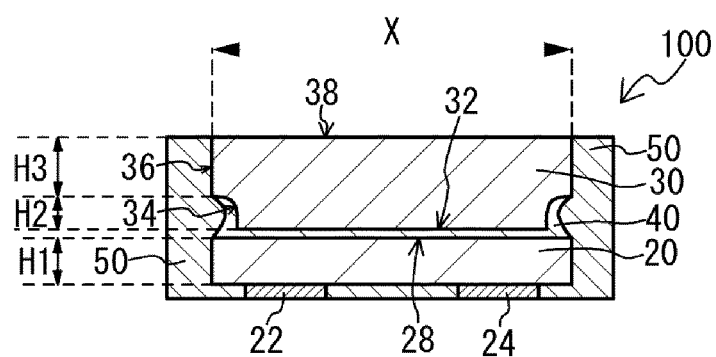
FIG. 1B is a view showing a cross-section along line A-A in FIG. 1A.

FIG. 1A is a schematic plan view of a light emitting device according to a first embodiment, and FIG. 1B is a view showing a cross-section along line A-A in FIG. 1A. As illustrated in FIGS. 1A and 1B a light emitting device 100 according to the first embodiment includes: a light emitting element 20; a light-transmissive member 30 which has a lower surface 32 positioned inside the peripheral edge of an upper surface 28 of the light emitting element 20 in plan view, a first lateral surface 34 having at least one inclined surface extending from the lower surface 32 and inclined with respect to the upper surface 28 of the light emitting element 20, and a second lateral surface 36 positioned above and outside the first lateral surface 34; a light-transmissive adhesive member 40 positioned inside the second lateral surface 36 in plan view, and bonding the upper surface 28 of the light emitting element 20 and the lower surface 32 of the light-transmissive member 30 to each other and covering the first lateral surface 34; and a light-reflective member 50 covering the second lateral surface 36. Hereinafter, the light emitting device will be described in detail.

(Light Emitting Element 20)

For the light emitting element 20, a light emitting diode can be used. As the light emitting diode, for example, a light emitting diode in which a layered structure including a light emitting layer is formed on a growth substrate can be used. The light emitting layer can be formed from various semiconductors such as nitride semiconductors including InN, AlN, GaN, InGaN, AlGaN and InAlGaN, and other group III-V compound semiconductors.

(Light-Transmissive Member 30)

The light-transmissive member 30 has an upper surface 38, and a lower surface 32 opposite to the upper surface 38. The upper surface 38 and the lower surface 32 are parallel to each other. Preferably, the lower surface 32 of the light-transmissive member 30 has a shape which is substantially similar to that of the upper surface 28 of the light emitting element 20 in plan view. The area of the lower surface 32 of the light-transmissive member 30 is smaller than the area of the upper surface 28 of the light emitting element 20, and the lower surface 32 of the light-transmissive member 30 is positioned inside the peripheral edge of the upper surface of the light emitting element 20 in plan view. Due to the shape, area and arrangement described above, the surface tension of the adhesive member 40 acts on the peripheral edge of the upper surface 28 of the light emitting element 20, and the adhesive member 40 creeps up on the first lateral surface 34 extending from the lower surface 32 of the light-transmissive member 30, so that the adhesive member 40 is less likely to sag from between the light emitting element 20 and the light-transmissive member 30 before curing of the adhesive member 40.

The light-transmissive member 30 has the first lateral surface 34 and the second lateral surface 36 between the lower surface 32 and the upper surface 38. The first lateral surface 34 of the light-transmissive member 30 extends from the lower surface 32 of the light-transmissive member. The first lateral surface 34 of the light-transmissive member 30 has at least one inclined surface inclined with respect to the upper surface 28 of the light emitting element 20. The second lateral surface 36 is positioned above and outside the first lateral surface 34.

The second lateral surface 36 of the light-transmissive member 30 is preferably perpendicular to the lower surface 32 of the light-transmissive member 30. Accordingly, the adhesive member 40 covering the first lateral surface 34 can be less likely to creep up along the second lateral surface 36, and therefore a self-alignment effect between the lower surface 32 of the light-transmissive member 30 and the upper surface 28 of the light emitting element 20 is easily exhibited.

When the second lateral surface 36 of the light-transmissive member 30 extends from the upper surface 38 of the light-transmissive member 30, the second lateral surface 36 is preferably perpendicular to the upper surface 38. Accordingly, when the upper surface 38 of the light-transmissive member 30 serves as the light emitting surface (i.e., region X) of a light emitting device 100, the light emitting device can be provided in which there is a sharp difference in luminance between a light-emitting section (i.e., region X) as a light emitting surface and a non-light-emitting section (i.e., region other than region X) with a clear boundary therebetween.

When the second lateral surface 36 of the light-transmissive member 30 extends from the upper surface 38 of the light-transmissive member 30, it is preferable that the upper surface 38 of the light-transmissive member 30 and the upper surface 28 of the light emitting element 20 have substantially the same shape, and are arranged so as to approximately overlap with each other in plan view. Accordingly, light emitted from the light emitting element 20 can be output from the upper surface 38 of the light-transmissive member 30 having an area approximately equivalent to that of the light-emission surface (i.e., upper surface) of the light emitting element 20, and therefore the light emitting device having reduced non-uniformity of light emission color can be provided.

The first lateral surface 34 of the light-transmissive member 30 has at least one inclined surface, which is inclined with respect to the upper surface 28 of the light emitting element 20. The inclined surface can be an inclined flat surface, which is flat and inclined (hereinafter referred to as "inclined flat surface), an inclined curved surface, which is curved and inclined (hereinafter referred to as "inclined curved surface"), or the like. The first lateral surface 34 may have only an inclined surface, or may have a surface other than an inclined surface, such as a surface perpendicular or parallel to the upper surface 28 of the light emitting element 20.

In this embodiment, the first lateral surface 34 of the light-transmissive member 30 has an inclined curved surface extending from the second lateral surface 36, and a vertical surface extending from the inclined curved surface and perpendicular to the upper surface 28 of the light emitting element 20. When the first lateral surface 34 has an inclined curved surface, it is preferable that the inclined curved surface is shaped to project to the inside of the light emitting device 100. With the curved surface having such a shape, the adhesive member 40 easily spreads smoothly over the first lateral surface 34, and therefore generation of voids in the adhesive member 40 can be reduced.

In this embodiment, the lower surface 32 and the first lateral surface 34 of the light-transmissive member 30 are in contact with each other, and the first lateral surface 34 and the second lateral surface 36 are in contact with each other. Also, the second lateral surface 36 and the upper surface 38 of the light-transmissive member 30 are in contact with each other. Of course, the second lateral surface 36 and the upper surface 38 of the light-transmissive member 30 are not required to be in contact with each other, and the light-transmissive member 30 may have the later-described third lateral surface 37, etc. between the second lateral surface 36 and the upper surface 38 of the light-transmissive member 30. The third lateral surface 37 is a lateral surface which is neither the first lateral surface 34 nor the second lateral surface 36.

The light-transmissive member 30 is light transmissive. In this specification, the light transmissive refers to a material having a transmittance of 50% or more to visible light in the state that the light-transmissive member 30 is mounted in the light emitting device. Specifically, the transmittance of the light-transmissive member 30 to light from the light emitting element 20 is preferably 70% or more, more preferably 80% or more or 90% or more. Accordingly, light emitted from the light emitting element 20 can be efficiently extracted to the outside.

Examples of the material may include glass materials such as silicate glass, borosilicate glass and quartz glass, resin molded bodies such as those of silicone resin, silicone modified resin, epoxy resin, phenol resin, polycarbonate resin, acrylic resin, trimethylpentene resin, polynorbornene resin, and hybrid resins including at least one of these resins, and sapphire.

For example, the light-transmissive member 30 may include a fluorescent material, a light diffusing material or the like therein, or include a layer containing a fluorescent material, a light diffusing material or the like on a surface thereof as long as the light-transmissive member 30 maintains light transmissivity. In the latter case, the layer containing a fluorescent material or a light diffusing material may be provided on a surface of the light-transmissive member 30 by, for example, coating such as a spray method, an electrodeposition method or an electrostatic coating method, or adhering method using a sheet etc. made of a resin with a fluorescent material or a light diffusing material dispersed therein.

Preferably, a material which can be excited by light from the light emitting element 20 is used for the fluorescent material. For the fluorescent material, one that is known in the art can be used. Specifically, a material such as an yttrium aluminum garnet (YAG)-based fluorescent material activated with cerium, a lutetium aluminum garnet (LAG)-based fluorescent material activated with cerium, a nitrogen-containing aluminosilicate calcium ($CaO-Al_2O_3.SiO_2$)-based fluorescent material activated with europium and/or chromium, a silicate $((Sr, Ba)_2SiO_4)$-based fluorescent material activated with europium, a β-sialon fluorescent material or a KSF (K2SiF6: Mn)-based fluorescent material can be used. Preferably, the light-transmissive member 30 contains the fluorescent material in an amount of about 5 to 50% by mass based on the total mass of the light-transmissive member 30.

The material of the fluorescent material may be, for example, a luminescent material that is called nanocrystals or quantum dots. Examples of the luminescent material may include semiconductor materials, for example semiconductors of group II-VI, group III-V or group IV-VI, specifically nanosized high-dispersion particles such as CdSe, core-shell-type $CdS_xSe_{1-x}/ZnS$, GaP and InAs. Here, the particle size of the fluorescent material is, for example, in a range of about 1 nm to 100 nm, preferably in a range of about 1 nm to 20 nm (equivalent to about 10 to 50 atoms). By using a fluorescent material including the above-mentioned luminescent material, internal scattering can be reduced, so that scattering of color-converted light can be reduced to further improve the light transmittance.

An organic luminescent material, for example, a luminescent material including an organic metal complex, may be used for the fluorescent material. Many of organic luminescent materials have high transparency, and therefore when an organic luminescent material is used as a fluorescent material, the same effect as in the case of using quantum dots can be obtained.

As a fluorescent material, one obtained by combining the foregoing materials in accordance with a type, a blending ratio and the like, suitable for a desired color can be used. In this way, the color rendering property and color reproducibility can be adjusted.

A fluorescent material itself, or a sintered body including a fluorescent material and a binding agent made of an inorganic substance can be used as the light-transmissive member 30 instead of incorporating a fluorescent material in another material to obtain the light-transmissive member 30. In this way, the light-transmissive member 30 can have good heat resistance.

When the light emitting device 100 includes a plurality of light-transmissive members 30, types and amounts of fluorescent materials contained in each of the light-transmissive members 30 may be different from one another.

For the light diffusing material, for example, silicon oxide, titanium oxide, zirconium oxide, magnesium oxide, magnesium carbonate, magnesium hydroxide, calcium carbonate, calcium hydroxide, calcium silicate, zinc oxide, barium titanate, aluminum oxide, glass or the like can be used.

The height H2 of the first lateral surface 34 in cross-section view of the light emitting device 100 is preferably low so that light extraction efficiency does not decrease, and specifically, the height H2 is, for example, preferably in a range of about 5% to 90%, more preferably in a range of about 5 to 50% of the height H1 of the light emitting element 20. The height H3 of the second lateral surface 36 in cross-section view of the light emitting device 100 is preferably low in light of down-sizing of the light emitting device 100, and specifically, the height H3 is, for example, preferably in a range of about 5% to 90%, more preferably in a range of about 50 to 95% of the height H1 of the light emitting element 20.

The height of the light-transmissive member 30 is can be appropriately specified and changed, but it is preferably low in terms of downsizing and light extraction efficiency of the light emitting device 100. Specifically, the total height of the first lateral surface 34 and the second lateral surface 36 is preferably about 50 to 300 μm.

(Adhesive Member 40)

The upper surface 28 of the light emitting element 20 and the lower surface 32 of the light-transmissive member 30 are adhered to each other with the light-transmissive adhesive member 40. The adhesive member 40 covers the first lateral surface 34 of the light-transmissive member 30. The adhesive member 40 is positioned inside the second lateral surface 36 of the light-transmissive member 30 in plan view. When the adhesive member 40 protrudes to the outside of the second lateral surface 36 in plan view, a part of light from the light emitting element 20 may enter into the light-reflective member from the protruding part without passing through the light-transmissive member 30, resulting in leakage of light from the upper surface of the light-reflective member. However, by positioning the adhesive member 40 inside the second lateral surface 36 as described above, such leakage of light can be inhibited, and it is thereby possible to provide a light emitting device in which there is a sharp difference in luminance between a light-emitting section (i.e., region X) and a non-light-emitting section (i.e., region other than region X), with a clear boundary therebetween.

For the adhesive member 40, for example, a resin material such as silicone resin or epoxy resin can be used. The adhesive member 40 may include the foregoing fluorescent material, light diffusing material, or other materials.

(Light-Reflective Member 50)

The light-reflective member 50 may include a light-reflective material that reflects light from the light emitting element 20. The reflectance of the light-reflective member 50 is preferably 60% or more, more preferably 80%, or further more preferably 90% or more to light from the light emitting element 20.

For a member as a base material of the light-reflective member 50, for example, a ceramic, a resin, a dielectric material, a pulp, a glass or a composite material thereof can be used. Particularly, a resin is preferably used, because resin can easily form the light-reflective member 50 in any shape. For a member as a base material of the light-reflective member 50, specifically a thermosetting resin, a thermoplastic resin or the like is preferably used, and more specifically silicone resin, modified silicone resin, epoxy resin, modified epoxy resin and acrylic resin, or a hybrid resin containing at least one kind of these resins is preferably used.

For the light-reflective material, a light reflecting material, a light scattering material, a coloring material, or a combination of two or more thereof is preferably used, and specifically titanium oxide, silicon oxide, zirconium oxide, barium titanate, alumina, aluminum nitride, boron nitride, mullite, niobium oxide, barium sulfate, carbon black, various kinds of rare earth oxides (e.g. yttrium oxide and gadolinium oxide) and so on are preferably used. The light-reflective member 50 may contain a fibrous filler such as glass fibers or wollastonite, etc. in addition to the light-reflective material.

The light-reflective member 50 can be formed by, for example, screen printing, potting, transfer molding, compression molding, or other methods.

The light-reflective member 50 covers the second lateral surface 36 of the light-transmissive member 30. The upper surface 38 of the light-transmissive member 30 is exposed from the light-reflective member 50. Accordingly, leakage of light to the outside of the light-transmissive member 30 from the second lateral surface 36 can be prevented, so that only the upper surface 38 of the light-transmissive member 30 serves as the light emitting surface (i.e., region X) of the light emitting device 100. Preferably, the light-reflective member 50 covers the adhesive member 40 covering the first lateral surface 34 of the light-transmissive member 30, and the lateral surface of the light emitting element 20 in addition to the second lateral surface 36 of the light-transmissive member 30. In this way, leakage of light from the first lateral surface 34 of the light-transmissive member 30 and the lateral surface of the light emitting element 20 is reduced, and it is thereby possible to provide a light emitting device in which there is a sharp difference in luminance between a light-emitting section (i.e., region X) and a non-light-emitting section (i.e., region other than region X), with a clear boundary therebetween.

According to the above-described light emitting device 100 according to the first embodiment, the adhesive member 40 is less likely to sag from between the light emitting element 20 and the light-transmissive member 30 before curing of the adhesive member 40. Accordingly, a self-alignment effect of the adhesive member 40 can be exerted to accurately arrange the light-transmissive member 30 in a desired orientation at a desired position on the light emitting element 20. Light emitted from the light emitting element 20 can be prevented from leaking out through the adhesive member 40, and it is thereby possible to provide a light emitting device in which there is a sharp difference in luminance between a light-emitting section (i.e., region X) and a non-light-emitting section (i.e., region other than region X), with a clear boundary therebetween.

[Light Emitting Device 200 According to Second Embodiment]

Figure 2A:
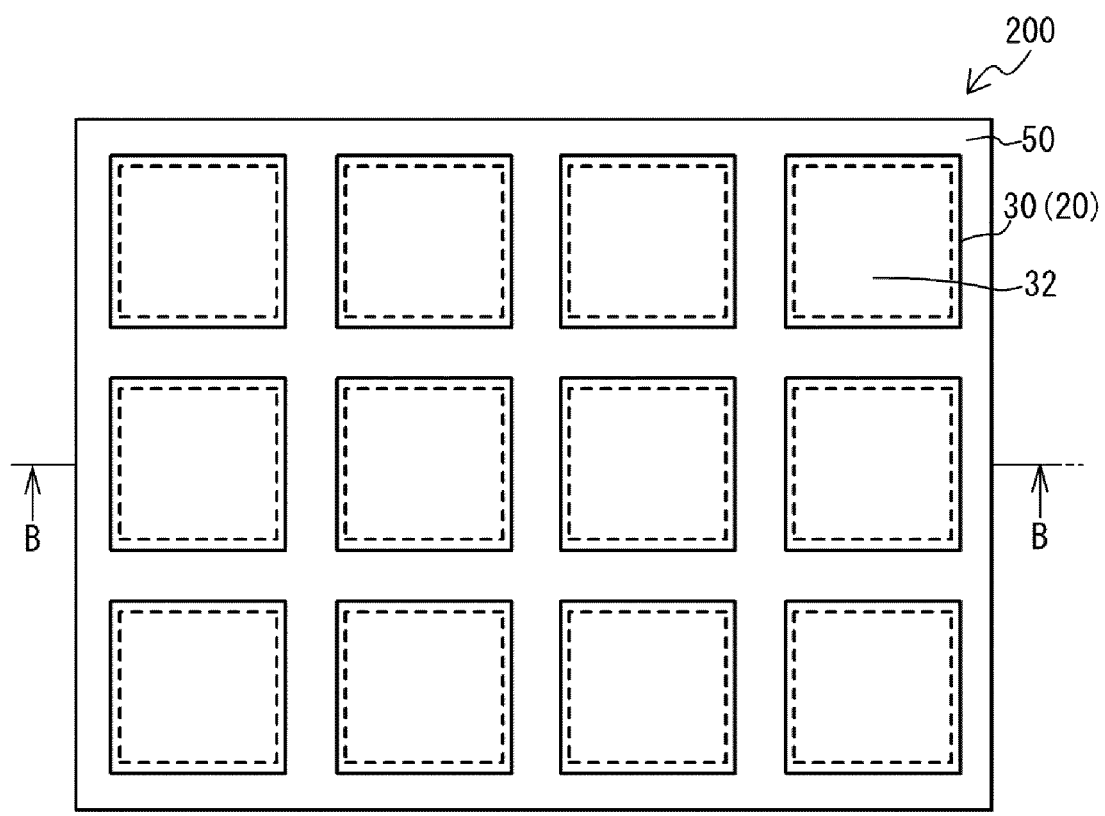
FIG. 2A is a schematic plan view of a light emitting device according to a second embodiment.
Figure 2B:
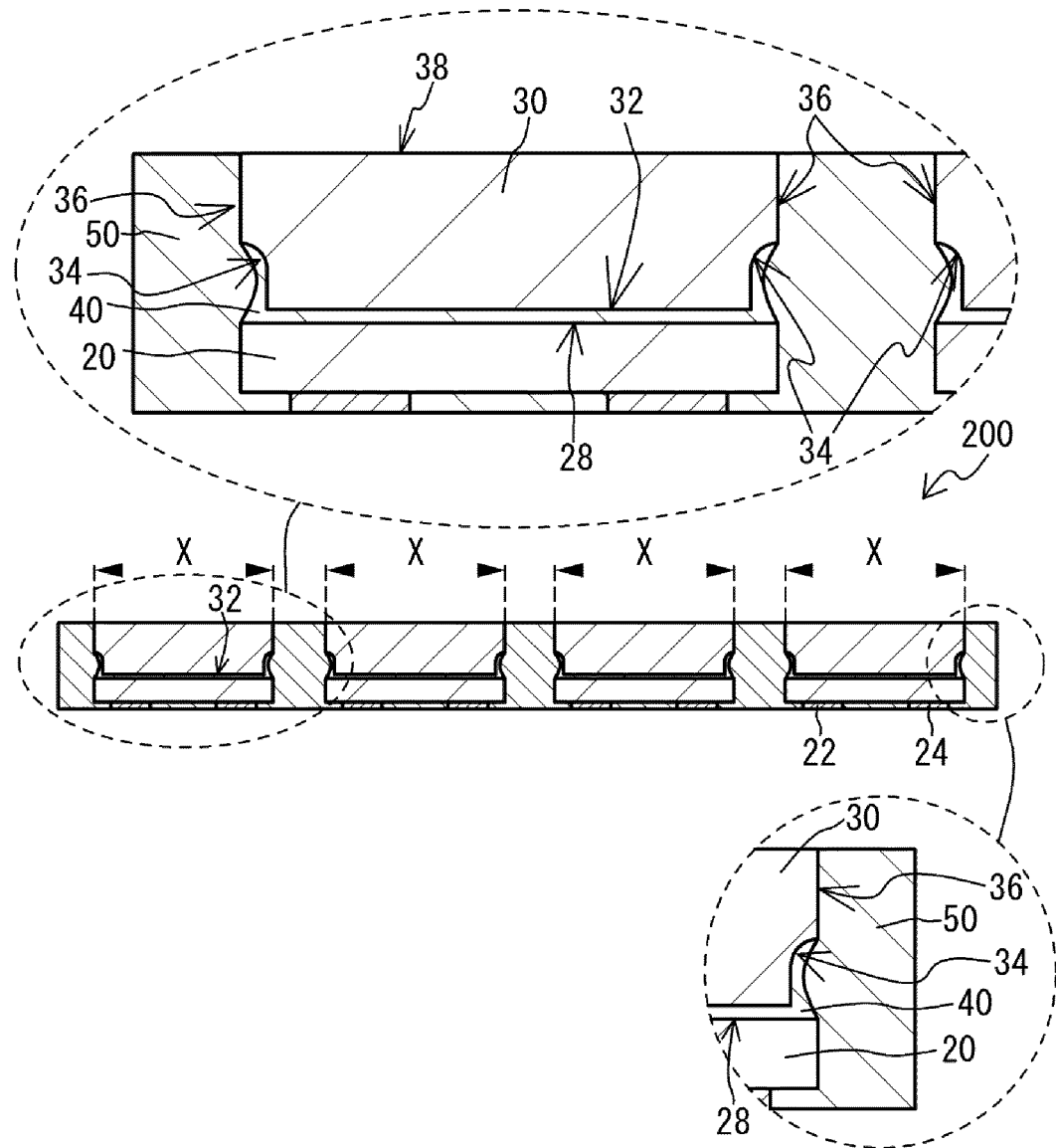
FIG. 2B is a view showing a cross-section along line B-B in FIG. 2A, and an enlarged cross-section of a region encircled by a broken line in the cross-section along line B-B.

FIG. 2A is a schematic plan view of a light emitting device according to a second embodiment. FIG. 2B is a view showing a cross-section along line B-B in FIG. 2A, and enlarged cross-sections of regions encircled by broken lines in the cross-section along line B-B. Unlike the light emitting device 100 according to the first embodiment, a light emitting device 200 according to the second embodiment includes a plurality of light emitting elements 20, a plurality of light-transmissive members 30 and a plurality of adhesive members 40 as shown in FIG. 2A and FIG. 2B. Each of a plurality of the light-transmissive members 30 and each of a plurality of the adhesive members 40 are arranged so as to correspond to each of a plurality of the light emitting elements 20.

As well as the light-transmissive member 30 in the first embodiment, the plurality of light-transmissive members 30 each have a first lateral surface 34 and a second lateral surface 36 between a lower surface 32 and an upper surface 38. The first lateral surface 34 of the light-transmissive member 30 has at least one inclined surface inclined with respect to an upper surface 28 of the light emitting element 20. The second lateral surface 36 of the light-transmissive member 30 is positioned above and outside the first lateral surface 34, and is approximately perpendicular to the lower surface 32 of the light-transmissive member 30.

In the light emitting device 200 according to the second embodiment, the light-transmissive member 30 can be accurately arranged in a desired orientation at a desired position on the light emitting element 20 as in the case of the light emitting device 100 according to the first embodiment. Light emitted from the light emitting element 20 is less likely to leak out through the adhesive member 40, and it is thereby possible to provide a light emitting device in which there is a sharp difference in luminance between a light-emitting section (i.e., region X) and a non-light-emitting section (i.e., region other than region X), with a clear boundary therebetween In the second embodiment, the second lateral surface 36 and the upper surface 38 of the light-transmissive member 30 are in contact with each other. The upper surface 38 of the light-transmissive member 30 and the upper surface 28 of the light emitting element 20 have substantially the same shape, and are arranged so as to approximately overlap with each other in plan view. Accordingly, in the light emitting device 200 according to the second embodiment, light emitted from the light emitting element 20 can be output from the upper surface 38 of the light-transmissive member 30 having an area approximately equivalent to that of the light-emission surface (i.e., upper surface) of the light emitting element 20, and therefore the light emitting device having reduced non-uniformity of light emission color can be provided. Further, with this configuration, the light emitting elements 20 can be easily arranged more closely. For example, the plurality of light emitting elements 20 can be arranged in a matrix like form.

In the second embodiment, the plurality of light-transmissive members 30 are held by one light-reflective member 50. However, this is an example, and the number of light-reflective members 50 is not limited. Specifically, a plurality of light-reflective members 50 may be provided so as to correspond, respectively, to the plurality of light emitting elements 20 and the plurality of light-transmissive members 30, or a plurality of light-reflective members 50 that hold a plurality of light-transmissive members 30 may be provided.

In the second embodiment, a plurality of light emitting elements 20 are arranged in a matrix like form. In this way, a light emitting device can be provided in which a plurality of light emission surfaces X are arranged in a matrix like form.

[Light Emitting Device 300 According to Third Embodiment]

Figure 3A:
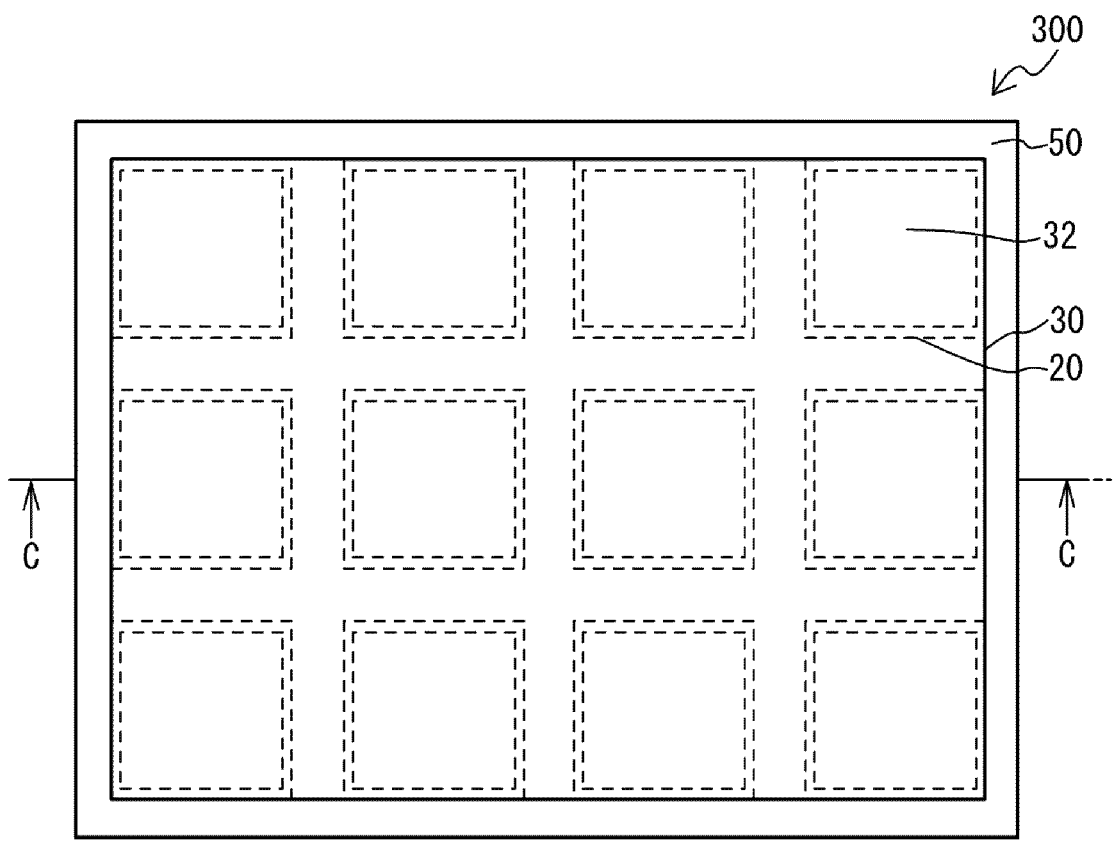
FIG. 3A is a schematic plan view of a light emitting device according to a third embodiment.
Figure 3B:
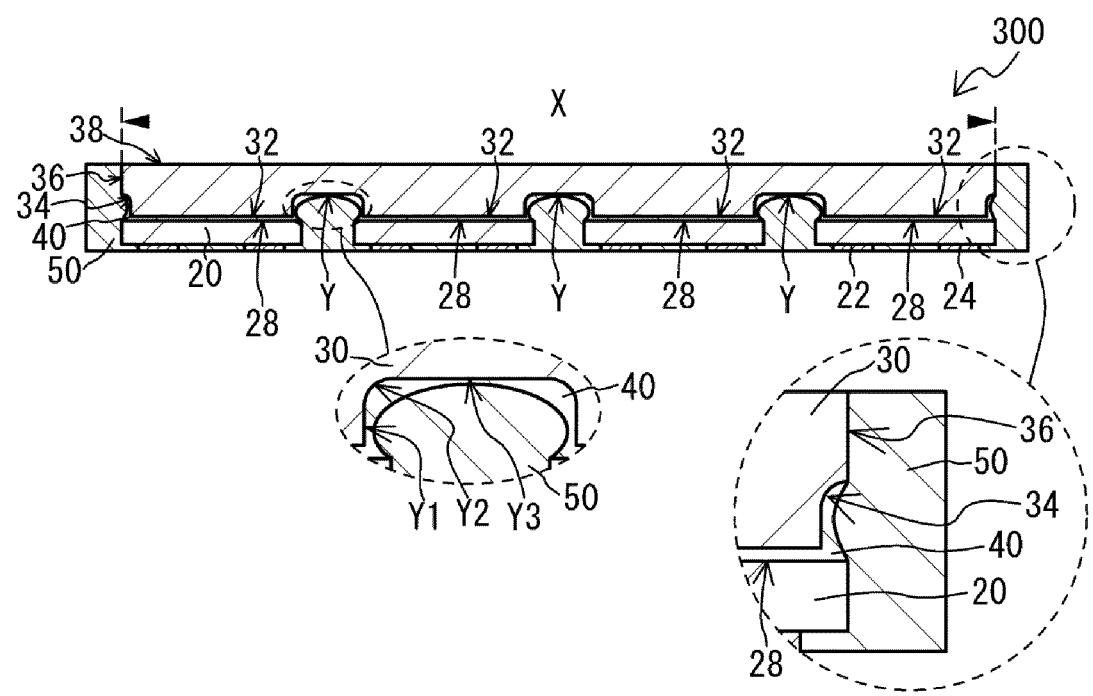
FIG. 3B is a view showing a cross-section along line C-C in FIG. 3A, and an enlarged cross-section of a region encircled by a broken line in the cross-section along line C-C.

FIG. 3A is a schematic plan view of a light emitting device according to a third embodiment. FIG. 3B is a view showing a cross-section along line C-C in FIG. 3A, and enlarged cross-sections of regions encircled by broken lines in the cross-section along line C-C. In a light emitting device 300 according to the third embodiment, unlike the light emitting device 200 according to the second embodiment, one light-transmissive member 30 is provided for a plurality of light emitting elements 20 as shown in FIG. 3A and FIG. 3B. One light-transmissive member 30 has one upper surface 38, while having a plurality of lower surfaces 32 which each corresponds to a plurality of light emitting elements 20. A first lateral surface 34 and a second lateral surface 36 are provided on the outer periphery of one light-transmissive member 30. A plurality of lower surfaces 32 are separated by groove sections Y, the area of each of the lower surfaces 32 is smaller than the area of the upper surface of each of a plurality of corresponding light emitting elements 20, and the lower surface 32 of the light-transmissive member 30 is positioned inside the peripheral edge of the upper surface 28 of the light emitting element 20 in plan view. The groove section Y has a vertical lateral surface Y1, an inclined lateral surface Y2 and a parallel surface (i.e., bottom surface of groove section Y) Y3. The vertical lateral surface Y1 is a surface which extends from the lower surface 32 of the light-transmissive member 30, and is perpendicular to the upper surface 28 of the light emitting element 20. The inclined lateral surface Y2 is a surface which extends from the vertical lateral surface Y1, and is inclined with respect to the upper surface 28 of the light emitting element 20. The parallel surface (i.e., bottom surface of groove section Y) Y3 is a surface which extends from the inclined lateral surface Y2, and is parallel to the lower surface 32 of the light-transmissive member 30. In this embodiment, the groove section Y of the light-transmissive member 30 has the vertical lateral surface Y1, the inclined lateral surface Y2 and the parallel surface (i.e., bottom surface of groove section Y) Y3, but this is an example, and the shape of the groove section Y is not limited thereto. For example, the groove section Y may be formed by only the inclined lateral surface Y2 inclined with respect to the upper surface 28 of the light emitting element 20.

Adhesive members 40 are each positioned on groove sections Y and lower surfaces 32, and adjacent adhesive members 40 positioned on lower surfaces 32 are in contact with each other through adhesive members 40 positioned on groove sections Y. Specifically, adhesive members 40 positioned on groove sections Y spread into groove sections Y to be in contact with adhesive members 40 positioned on lower surfaces 32 to one another, so that a plurality of adhesive members 40 each positioned on groove sections Y and lower surfaces 32 form one member. When a plurality of adhesive members 40 are formed as one member as described above, light from light emitting elements 20 is easily propagated to the light-transmissive member 30 through adhesive members 40 positioned in groove sections Y, to thereby reduce non-uniformity of light emission color in regions immediately above the light emitting elements 20 and regions immediately above the groove sections Y in the upper surface 38 of the light-transmissive member 30.

In the light emitting device 300 according to the third embodiment, the light-transmissive member 30 can be accurately arranged in a desired orientation at a desired position on the light emitting element 20 as in the case of the light emitting device 100 according to the first embodiment. Light emitted from the light emitting element 20 is less likely to leak out through the adhesive member 40, and therefore it is possible to provide a light emitting device in which there is a sharp difference in luminance between a light-emitting section (i.e., region X) and a non-light-emitting section (i.e., region other than region X), with a clear boundary therebetween.

[Light Emitting Device 400 According to Fourth Embodiment]

Figure 4A:
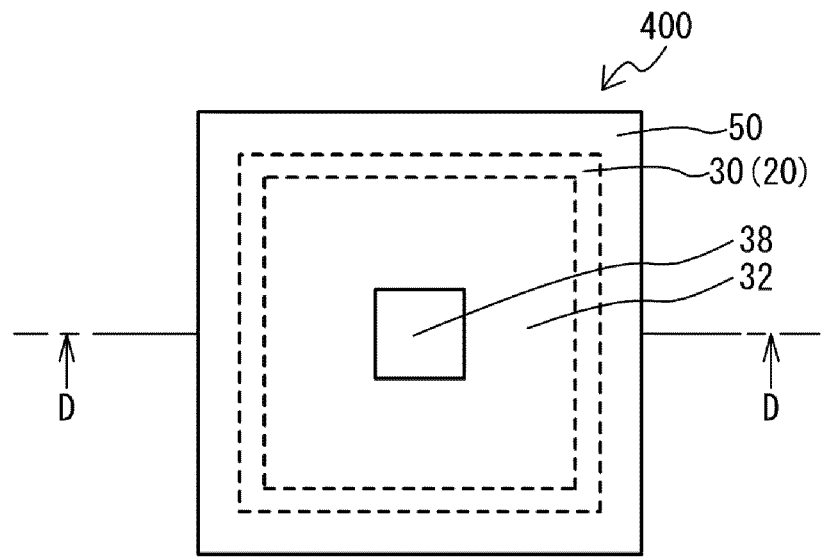
FIG. 4A is a schematic plan view of a light emitting device according to a fourth embodiment.
Figure 4B:
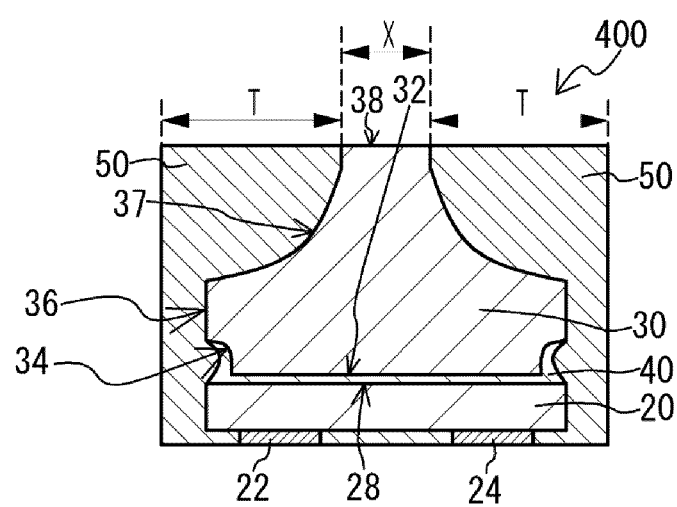
FIG. 4B is a view showing a cross-section along line D-D in FIG. 4A.

FIG. 4A is a schematic plan view of a light emitting device according to a fourth embodiment, and FIG. 4B is a view showing a cross-section along line D-D in FIG. 4A. The light emitting device 400 according to the fourth embodiment is different from the light emitting device 100 according to the first embodiment in that a light-transmissive member 30 has a third lateral surface 37 between a second lateral surface 36 and an upper surface 38 as shown in FIG. 4A and FIG. 4B. The third lateral surface 37 is of a gradually inclined curve projecting to the inside of the light emitting device 400.

The inclination angle of the third lateral surface 37, in other words, inclination angle of a straight line connecting both ends of third lateral surface 37, is preferably not less than 30 degrees and not more than 60 degrees with respect to the lower surface 32 in cross-section view. When the inclination angle is less than 30 degrees, the thickness T of a light-reflective member 50 covering the third lateral surface 37 decreases, which increase the possibility that scattered light in a light-transmissive member 30 is not sufficiently reflected by the light-reflective member 50, and leaks out from the light-reflective member 50. When the inclination angle is more than 60 degrees, conversely the width T excessively increases to cause an increase in size of the light emitting device itself, and increase the possibility that light incident into the light-transmissive member 30 is attenuated before arriving at the upper surface 38 (light emitting surface X of light emitting device 400).

Further, the light emitting device 400 according to the fourth embodiment is different from the light emitting device according to the first embodiment in that the area of the upper surface 38 of the light-transmissive member 30 is smaller than the area of the upper surface 28 of the light emitting element 20. When the area of the upper surface 38 extending from the third lateral surface 37 is smaller than the area of the upper surface 28 of the light emitting element 20 as described above, the emission area of light emitted from the upper surface 38 of the light-transmissive member 30 can be made smaller than that of the light-emission surface of the light emitting element 20, so that a higher-luminance light emitting device can be provided.

Here, the outer edge of the second lateral surface 36 of the light-transmissive member 30 in plan view is preferably substantially coincident with the outer edge of the upper surface 28 of the light emitting element 20. In this way, light emitted from the light emitting element 20 is less likely to leak out through the adhesive member 40, and therefore it is possible to provide a light emitting device in which there is a sharp difference in luminance between a light-emitting section (i.e., region X) and a non-light-emitting section (i.e., region other than region X), with a clear boundary therebetween.

In the light emitting device 400 according to the fourth embodiment, the light-transmissive member 30 can be accurately arranged in a desired orientation at a desired position on the light emitting element 20 as in the case of the light emitting device 100 according to the first embodiment.

Other Examples of Light-Transmissive Members 301

Hereinafter, other examples of light-transmissive members 30 will be described. With light-transmissive members 30 having a shape as described below, the light-transmissive member 30 can be accurately arranged in a desired orientation at a desired position on the light emitting element 20 as described later. Light emitted from the light emitting element 20 is less likely to leak out through the adhesive member 40, to thereby provide a light emitting device in which there is a sharp difference in luminance between a light-emitting section (i.e., region X) and a non-light-emitting section (i.e., region other than region X) and the boundary therebetween is clear.

Figure 5:
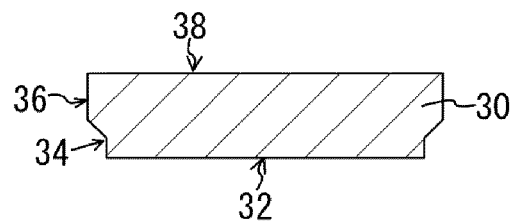
FIG. 5 is a schematic sectional view of a light-transmissive member.

FIG. 5 is a schematic sectional view of a light-transmissive member. As shown in FIG. 5, a first lateral surface 34 of the light-transmissive member 30 has an inclined flat surface extends from a second lateral surface 36, and at least one vertical surface which extends from the inclined flat surface and is perpendicular to a lower surface 32 of the light-transmissive member 30. With the light-transmissive member 30 having a shape as described above, the same effect as in the foregoing light emitting devices can be obtained.

Figure 6A:
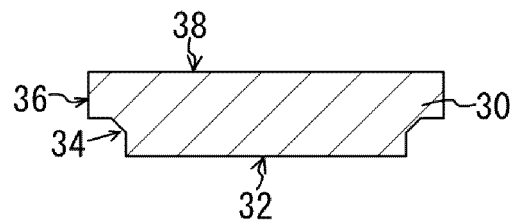
FIG. 6A is a schematic sectional view of a light-transmissive member.
Figure 6B:
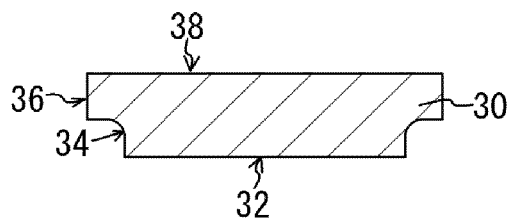
FIG. 6B is a schematic sectional view of a light-transmissive member.
Figure 6C:
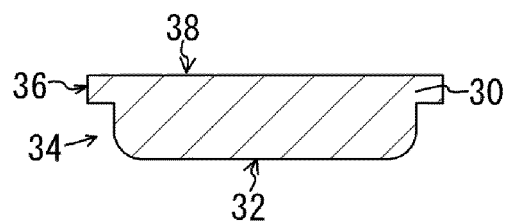
FIG. 6C is a schematic sectional view of a light-transmissive member.

FIGS. 6A to 6C are schematic sectional views of a light-transmissive member. As shown in FIGS. 6A and 6B, a first lateral surface 34 of the light-transmissive member 30 has a vertical surface perpendicular to an upper surface 28 of a light emitting device 20, an inclined flat surface or inclined curved surface extending from the vertical surface, and at least one parallel surface which is positioned between the inclined flat surface or inclined curved surface and a second lateral surface 36, and is parallel to a lower surface 32 of the light-transmissive member 30. With the light-transmissive member 30 having a shape as described above, the same effect as in the foregoing light emitting devices can be obtained. Since the first lateral surface 34 has a parallel surface, the first lateral surface 34 and the second lateral surface 36 are in perpendicular contact with each other, and therefore the adhesive member 40 can more reliably reduce creeping up along the second lateral surface 36.

A first lateral surface 34 of the light-transmissive member 30 shown in FIG. 6C has a parallel surface which extends from a second lateral surface 36 and is parallel to a lower surface 32, and an inclined curved surface extending from the parallel surface. The inclined curved surface in FIG. 6C is an inclined curved surface projecting to the outside of the light emitting device. To form the inclined curved surface being in shape of a curve projecting to the outside, scattered light on the light-transmissive member 30 is easily reflected by the first lateral surface 34, and therefore light extraction efficiency can be more effectively improved.

Figure 7:
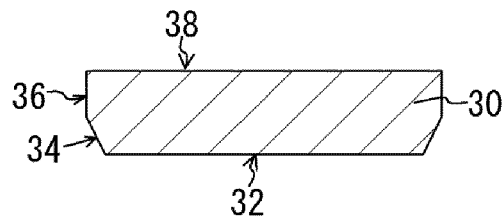
FIG. 7 is a schematic sectional view of a light-transmissive member.

FIG. 7 is a schematic sectional view of a light-transmissive member. A first lateral surface 34 of the light-transmissive member 30 may be formed by at least one inclined flat surface as shown in FIG. 7. With the light-transmissive member 30 having a shape as described above, the same effect as in the foregoing light emitting devices can be obtained.

Figure 8A:
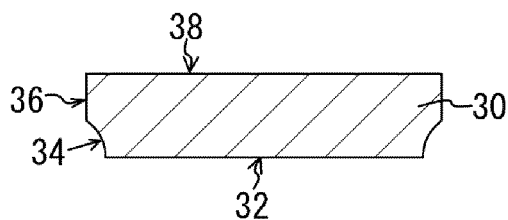
FIG. 8A is a schematic sectional view of a light-transmissive member.
Figure 8B:
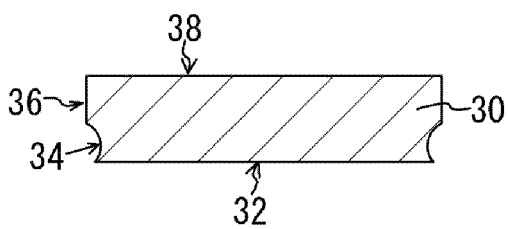
FIG. 8B is a schematic sectional view of a light-transmissive member.
Figure 8C:
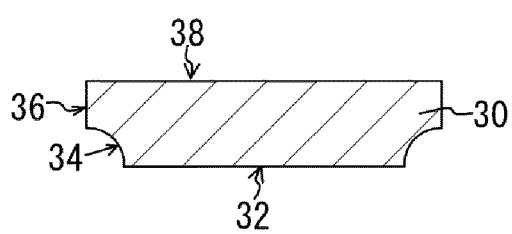
FIG. 8C is a schematic sectional view of a light-transmissive member.

FIGS. 8A to 8C are schematic sectional views of a light-transmissive member. A first lateral surface 34 of the light-transmissive member 30 may be formed by one inclined curved surface or a combination of a plurality of inclined curved surfaces as shown in FIGS. 8A to 8C. With the light-transmissive member 30 having a shape as described above, the same effect as in the foregoing light emitting devices can be obtained.

[Example of Manufacturing Method]

Hereinafter, a method for manufacturing the light emitting device 200 according to the second embodiment will be described. While the light emitting device 200 according to the second embodiment is described here, the light emitting devices 100, 300 and 400 according to the first, third and fourth embodiments can be manufactured in the same manner.

(One Example of Manufacturing Method)

FIGS. 9A to 9E are views showing one example of the method for manufacturing the light-emitting device according to the second embodiment. Hereinafter, the manufacturing method will be described with reference to FIGS. 9A to 9E.

Figure 9A:
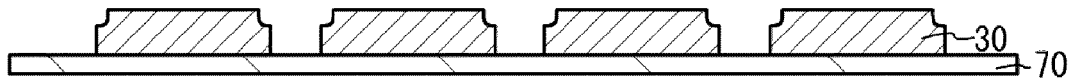
FIG. 9A is a view showing one example of a method for manufacturing a light emitting device according to a second embodiment.

First, a plurality of light-transmissive members 30 are arranged on a sheet 70 so that the lower surface 32 of each light-transmissive member 30 faces upward as shown in FIG. 9A.

Figure 9B:
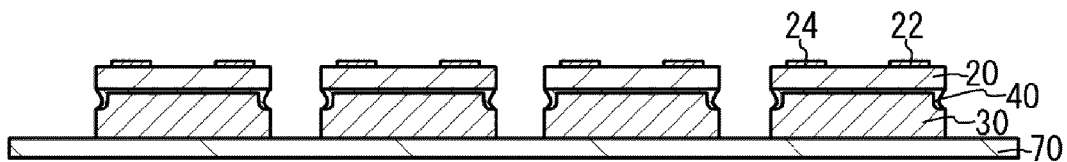
FIG. 9B is a view showing one example of the method for manufacturing the light emitting device according to the second embodiment.

Subsequently, a plurality of light emitting elements 20 are arranged on a plurality of light-transmissive members 30 with the adhesive member 40 interposed between each light emitting element 20 and each light-transmissive member 30 so that the lower surface of each light emitting element 20 faces upward as shown in FIG. 9B. The adhesive member 40 spreads from the lower surface 32 of the light-transmissive member 30 to the first lateral surface 34 extending from the lower surface 32.

Figure 9C:
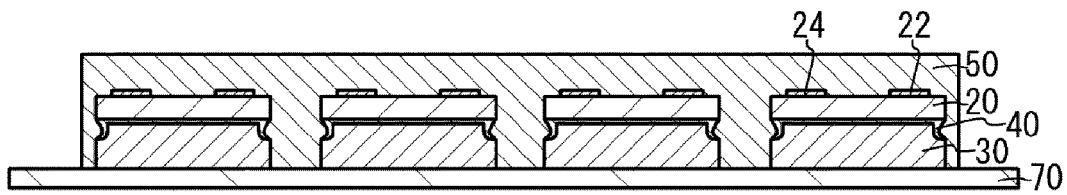
FIG. 9C is a view showing one example of the method for manufacturing the light emitting device according to the second embodiment.

Subsequently, the plurality of light-transmissive members 30 and the plurality of light emitting elements 20 are covered with the light-reflective member 50 as shown in FIG. 9C. The plurality of light-transmissive members 30 and the plurality of light emitting elements 20 are fully embedded in the light-reflective member 50. The light-reflective member 50 arranged between each of the plurality of light-transmissive members 30 and each of the plurality of light emitting elements 20 is integral (i.e., formed as a single piece), so that the plurality of light-transmissive members 30 and the plurality of light emitting elements 20 are held by the integral light-reflective member 50.

Figure 9D:
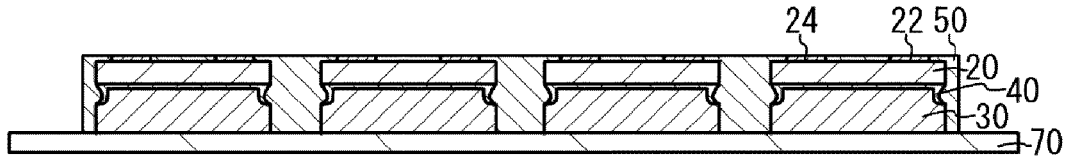
FIG. 9D is a view showing one example of the method for manufacturing the light emitting device according to the second embodiment.

Subsequently, electrodes 22 and 24, which are positioned on the lower surface 32 of each of the plurality of light emitting elements 20, are exposed from the light-reflective member 50 by grinding the light-reflective member 50 from the lower surface side of the light emitting elements 20 as shown in FIG. 9D. The electrodes 22 and 24 of the light emitting elements 20, which are exposed from the light-reflective member 50, can serves as external electrodes of the light emitting element 200 to connect to a mounting board.

Figure 9E:
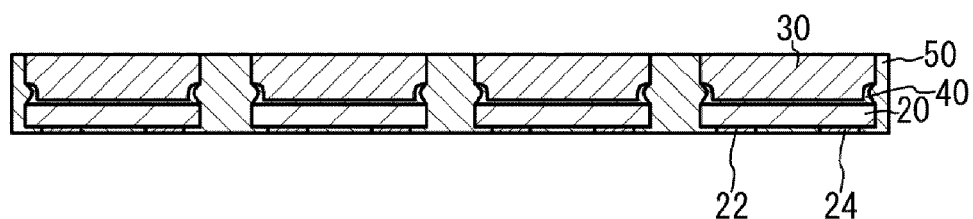
FIG. 9E is a view showing one example of the method for manufacturing the light emitting device according to the second embodiment.

Subsequently, the sheet 70 is removed as shown in FIG. 9E. Before or after removal of the sheet 70, the light emitting device 200 can be divided in a desired size as necessary. Since the plurality of light-transmissive members 30 and the plurality of light emitting elements 20 are held by the light-reflective member 50, the light emitting device 200 can also be mounted on a curved surface in the case where the light-reflective member 50 employs a high-flexibility resin.

The manufacturing method described above as one example is effective particularly as a method for manufacturing the light emitting device 200 having a plurality of light emitting surfaces X because the heights of the upper surfaces of light-transmissive members 30 are easily made uniform. According to the manufacturing method described above as one example, it is capable of providing a chip size package type light emitting device, which can be mounted on mounting boards in various kinds, for example, a mounting board having curved surface.

(Another Example of Manufacturing Method)

Figure 10A:
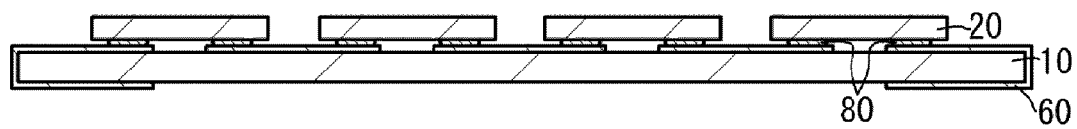
FIG. 10A is a view showing another example of a method for manufacturing the light emitting device according to the second embodiment.
Figure 10B:
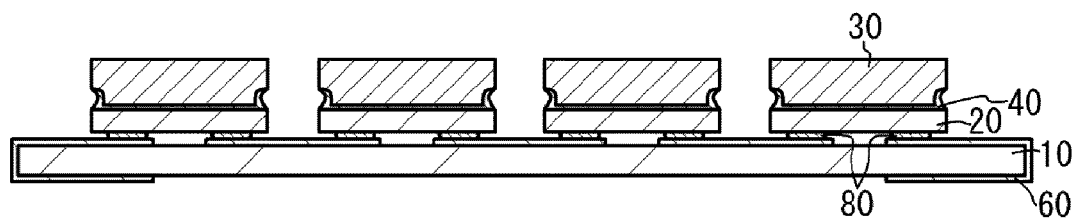
FIG. 10B is a view showing another example of the method for manufacturing the light emitting device according to the second embodiment.
Figure 10C:
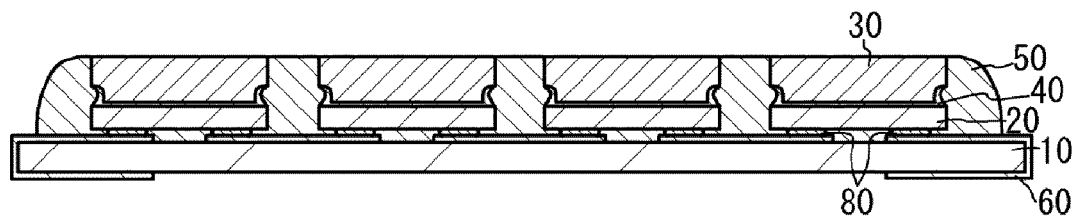
FIG. 10C is a view showing another example of the method for manufacturing the light emitting device according to the second embodiment.

FIGS. 10A to 10C are views showing another example of a method for manufacturing the light emitting device according to the second embodiment. Hereinafter, the manufacturing method will be described with reference to FIGS. 10A to 10C.

First, a plurality of light emitting devices 20 are mounted on an electrically conductive member 60 of a light emitting element mounting board 10 with a bonding member 80 interposed between each light emitting element 20 and the conductive member 60 as shown in FIG. 10A.

Subsequently, a plurality of light-transmissive members 30 are arranged on a plurality of light emitting elements 20 with the adhesive member interposed between each light emitting element 20 and each light-transmissive member 30 as shown in FIG. 10B. The adhesive member 40 creeps up the first lateral surface 34 of the light-transmissive member 30. The surface tension of the adhesive member 40 acts at the peripheral edge of the upper surface 28 of the light emitting element 20.

Subsequently, the light-reflective member 50 is provided so as to hold a plurality of light-transmissive members 30 as shown in FIG. 10C.

The light emitting device 200 including the light emitting element mounting board 10 can be thus prepared.

According to the manufacturing method described above as another example, satisfactory heat dissipation performance can be obtained when a plurality of light emitting elements 20 are densely mounted on the light emitting element mounting board 10, and applied with a large current. The bonding stability of the light emitting elements 20 in the light emitting device 200 can be improved.

While embodiments have been described above, the descriptions of these embodiments do not limit the constitutions described in claims.

What is claimed is:

1. A light emitting device comprising:
    a light emitting element;
    a light-transmissive member that contains a fluorescent material and includes:
        a lower surface positioned inside a peripheral edge of an upper surface of the light emitting element in a plan view,
        a first lateral surface extending from the lower surface and having at least one inclined surface that is inclined with respect to the upper surface of the light emitting element, and
        a second lateral surface positioned above and outside the first lateral surface,
        wherein, in the plan view, an outer edge of the second lateral surface overlaps with an outer edge of the upper surface of the light emitting element;
    a light-transmissive adhesive member positioned inside the second lateral surface in the plan view, wherein the adhesive member adheres the upper surface of the light emitting element and the lower surface of the light-transmissive member to each other and covers the first lateral surface; and
    a light-reflective member covering the second lateral surface.

2. The light emitting device according to claim 1, wherein the second lateral surface is approximately perpendicular to the lower surface of the light-transmissive member.

3. The light emitting device according to claim 1, wherein:
    the light emitting device comprises a plurality of the light emitting elements, a plurality of the light-transmissive members, and a plurality of the adhesive members, and
    the plurality of light-transmissive members and the plurality of adhesive members are each arranged on the light emitting elements.

4. The light emitting device according to claim 3, wherein the plurality of light-transmissive members are held by the light-reflective member.

5. The light emitting device according to claim 1, wherein:
    the light emitting device comprises a plurality of the light emitting elements, and
    the light-transmissive member has a plurality of the lower surfaces which are separated by groove sections so as to correspond, respectively, to the plurality of light emitting elements.

6. The light emitting device according to claim 5, wherein:
    the light emitting device comprises a plurality of the adhesive members,
    the adhesive members include first portions located on the groove sections and second portions located on the lower surfaces, and
    adjacent second portions of the adhesive members are in contact with each other through the first portions of the adhesive members.

7. The light emitting device according to claim 3, wherein the plurality of light emitting elements are arranged in an array.

8. The light emitting device according to claim 1, wherein the first lateral surface has at least one vertical surface approximately perpendicular to the lower surface of the light-transmissive member.

9. The light emitting device according to claim 1, further comprising a light emitting element mounting board on which the light emitting element is mounted.

10. The light emitting device according to claim 1, wherein the light-transmissive member contains a fluorescent material.

11. The light emitting device according to claim 1, wherein the adhesive member contains a fluorescent material.

12. The light emitting device according to claim 1, wherein a height of the first lateral surface is in a range of about 5% to 90% of a height of the light emitting element.

13. The light emitting device according to claim 1, wherein a height of the second lateral surface is, for example, in a range of about 5 to 90% of a height of the light emitting element.

14. The light emitting device according to claim 1, wherein a height from a lower end of the first lateral surface to an upper end of the second lateral surface of the light transmissive member is in a range about 50 μm to 300 μm.

15. The light emitting device according to claim 1, wherein the light-transmissive member has a third lateral surface between an upper surface of the light-transmissive member and the second lateral surface of the light-transmissive member.

16. The light emitting device according to claim 15, wherein the third lateral surface includes an inclined curved surface.

17. The light emitting device according to claim 15, wherein an inclination angle of a straight line connecting both ends of the third lateral surface in a cross-sectional view is not less than 30 degrees and not more than 60 degrees with respect to the lower surface.

18. The light emitting device according to claim 15, wherein an area of an upper surface of the light-transmissive member is smaller than an area of the upper surface of the light emitting element.

19. The light emitting device according to claim 1, wherein the second lateral surface of the light-transmissive member extends from an upper surface of the light-transmissive member and the second lateral surface of the light-transmissive member is perpendicular to an upper surface of the light-transmissive member.

* * * * *